(12) United States Patent
Wang et al.

(10) Patent No.: US 9,818,606 B2
(45) Date of Patent: Nov. 14, 2017

(54) AMORPHOUS SILICON THICKNESS UNIFORMITY IMPROVED BY PROCESS DILUTED WITH HYDROGEN AND ARGON GAS MIXTURE

(71) Applicant: Applied Materials, Inc., Santa Clara, CA (US)

(72) Inventors: Qunhua Wang, Santa Clara, CA (US); Lai Zhao, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 517 days.

(21) Appl. No.: 14/281,492

(22) Filed: May 19, 2014

(65) Prior Publication Data

US 2014/0357065 A1 Dec. 4, 2014

Related U.S. Application Data

(60) Provisional application No. 61/829,849, filed on May 31, 2013.

(51) Int. Cl.
| | |
|---|---|
| *H01L 21/00* | (2006.01) |
| *H01L 21/02* | (2006.01) |
| *C23C 16/24* | (2006.01) |
| *C23C 16/56* | (2006.01) |

(52) U.S. Cl.
CPC ........ *H01L 21/02595* (2013.01); *C23C 16/24* (2013.01); *C23C 16/56* (2013.01); *H01L 21/0262* (2013.01); *H01L 21/02488* (2013.01); *H01L 21/02502* (2013.01); *H01L 21/02532* (2013.01); *H01L 21/02686* (2013.01); *H01L 21/02592* (2013.01)

(58) Field of Classification Search
CPC ......... H01L 21/02488; H01L 21/02502; H01L 21/02592; H01L 21/0262
See application file for complete search history.

(56) References Cited

U.S. PATENT DOCUMENTS

| | | | | |
|---|---|---|---|---|
| 6,235,563 | B1 * | 5/2001 | Oka et al. | 438/166 |
| 6,656,799 | B2 * | 12/2003 | Iwata et al. | 438/270 |
| 2008/0135893 | A1 * | 6/2008 | Park et al. | 257/288 |

\* cited by examiner

*Primary Examiner* — Richard Booth
(74) *Attorney, Agent, or Firm* — Patterson + Sheridan LLP

(57) ABSTRACT

The embodiments described herein generally relate to methods for forming an amorphous silicon structure that may be used in thin film transistor devices. In embodiments disclosed herein, the amorphous silicon layer is deposited using a silicon-based gas with an activation gas comprising a high concentration of inert gas and a low concentration of hydrogen-based gas. The activation gas combination allows for a good deposition profile of the amorphous silicon layer from the edge of the shadow frame which is translated to the polycrystalline silicon layer post-annealing.

18 Claims, 4 Drawing Sheets

AMORPHOUS SILICON THICKNESS UNIFORMITY IMPROVED BY PROCESS DILUTED WITH HYDROGEN AND ARGON GAS MIXTURE

CROSS-REFERENCE TO RELATED APPLICATIONS

This application claims benefit of U.S. Provisional Patent Application Ser. No. 61/829,849, filed May 31, 2013, which is herein incorporated by reference.

BACKGROUND

Field

Embodiments disclosed herein generally relate to methods for forming a silicon-containing layer. More particularly, embodiments herein relate to methods for forming a silicon-containing layer that may be used in thin film transistor (TFT) devices.

Description of the Related Art

Low Temperature Poly Silicon (LTPS) is commonly used as the channel layer in the next generation TFT display and Active Matrix Organic Light Emitting Diode (AMOLED) due to benefits including high mobility (>50 $cm^2/Vs$) and producibility under low temperature (<500° C.). LTPS is commonly produced using an amorphous silicon structure.

A common method to crystallize the amorphous silicon structure in industry is through excimer laser annealing (ELA). Both film properties of the amorphous silicon structure and process conditions of the ELA have effects in determining the process of the crystallization and therefore the film properties as well as the final device performance.

The ever-progressing display technology calls for a channel layer with larger driving current, better uniformity and less production cost. These demands require high quality polycrystalline silicon with higher mobility (above 90 $cm^2/Vs$) while keep using current equipment set of Plasma Enhanced Chemical Vapor Deposition (PECVD) and the ELA tool. Larger and more uniform crystalline grain size can benefit mobility. However, current techniques are limited to a grain size below 300~500 nm.

Thus, there is a continuing need for methods of forming highly crystalline silicon-containing materials.

SUMMARY

The embodiments described herein generally relate to formation of an amorphous silicon layer with high deposition uniformity for use in production of a polycrystalline silicon layer.

In one embodiment, a method can include positioning a substrate in a processing region of a process chamber, wherein the substrate has a surface with at least one exposed layer formed thereon; delivering a silicon-containing precursor and an activation gas to a processing region, the activation gas comprising an inert gas and a hydrogen-based gas; depositing an amorphous silicon layer from the silicon-containing precursor and the activation gas, the silicon-containing precursor and the activation gas being activated by a plasma; dehydrogenating the amorphous silicon layer; and annealing the amorphous silicon layers to form a polycrystalline silicon layer after the dehydrogenation.

In another embodiment, a method can include positioning a substrate in a processing region of a process chamber, the substrate comprising a first surface; depositing a first buffer layer comprising silicon nitride on the first surface; depositing a second buffer layer comprising silicon oxide on the first buffer layer; delivering a silicon-containing precursor and an activation gas to a processing region, the activation gas comprising an inert gas and a hydrogen-based gas; depositing an amorphous silicon layer from the silicon-containing precursor and the activation gas, the silicon-containing precursor and the activation gas being activated by a plasma; dehydrogenating the amorphous silicon layer; and annealing the amorphous silicon layers to form a polycrystalline silicon layer after the dehydrogenation.

In another embodiment, a method can include positioning a substrate in a processing region of a process chamber, the substrate comprising a first surface; depositing a first buffer layer comprising silicon nitride on the first surface of the substrate; depositing a second buffer layer comprising silicon oxide on the first buffer layer; delivering a deposition gas comprising silane or disilane and an activation gas to a processing region, the activation gas substantially comprising argon gas (Ar) and hydrogen gas ($H_2$); depositing an amorphous silicon layer from the silicon-containing precursor and the activation gas, the silicon-containing precursor and the activation gas being activated by a plasma; dehydrogenating the amorphous silicon layer; and annealing the amorphous silicon layers to form a polycrystalline silicon layer after the dehydrogenation.

BRIEF DESCRIPTION OF THE DRAWINGS

So that the manner in which the above recited features can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of the scope of the disclosure, for the inventions may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to methods for forming a silicon-containing layer that may be used in TFT devices. The embodiments disclosed herein are more clearly described with reference to the figures below.

The embodiments disclosed herein are illustratively described below utilized in a processing system, such as a PECVD system available from AKT America, a division of Applied Materials, Inc., located in Santa Clara, Calif. However, it should be understood that the embodiments described herein have utility in other system configurations, including those sold by other manufacturers.

Figure 1:
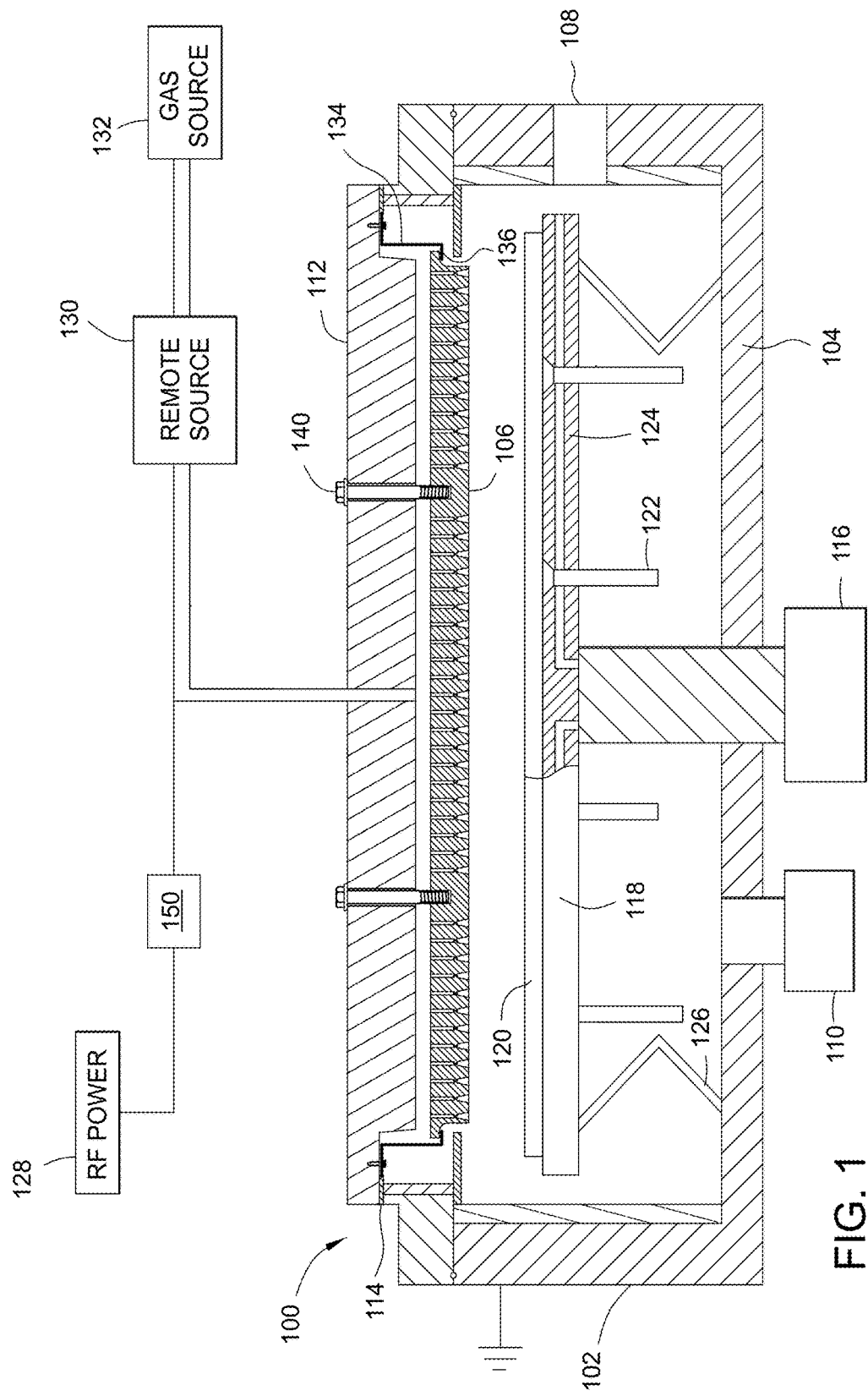
FIG. 1 is a schematic, cross sectional view of a process chamber that may be used to perform the operations described herein.

FIG. 1 is a schematic, cross sectional view of an apparatus that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 can also include RF return straps 126 to provide an RF return path at the periphery of the substrate support 118.

The showerhead 106 can be coupled to a backing plate 112 by a fastening mechanism 140. The showerhead 106 may be coupled to the backing plate 112 by one or more fastening mechanisms 140 to help prevent sag and/or control the straightness/curvature of the showerhead 106.

A gas source 132 can be coupled to the backing plate 112 to provide process gases through gas passages in the showerhead 106 to a processing area between the showerhead 106 and the substrate 120. The gas source 132 can include a silicon-containing gas supply source, an oxygen containing gas supply source, and a carbon-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 110 is coupled to the chamber 100 to control the process volume at a desired pressure. An RF source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2:
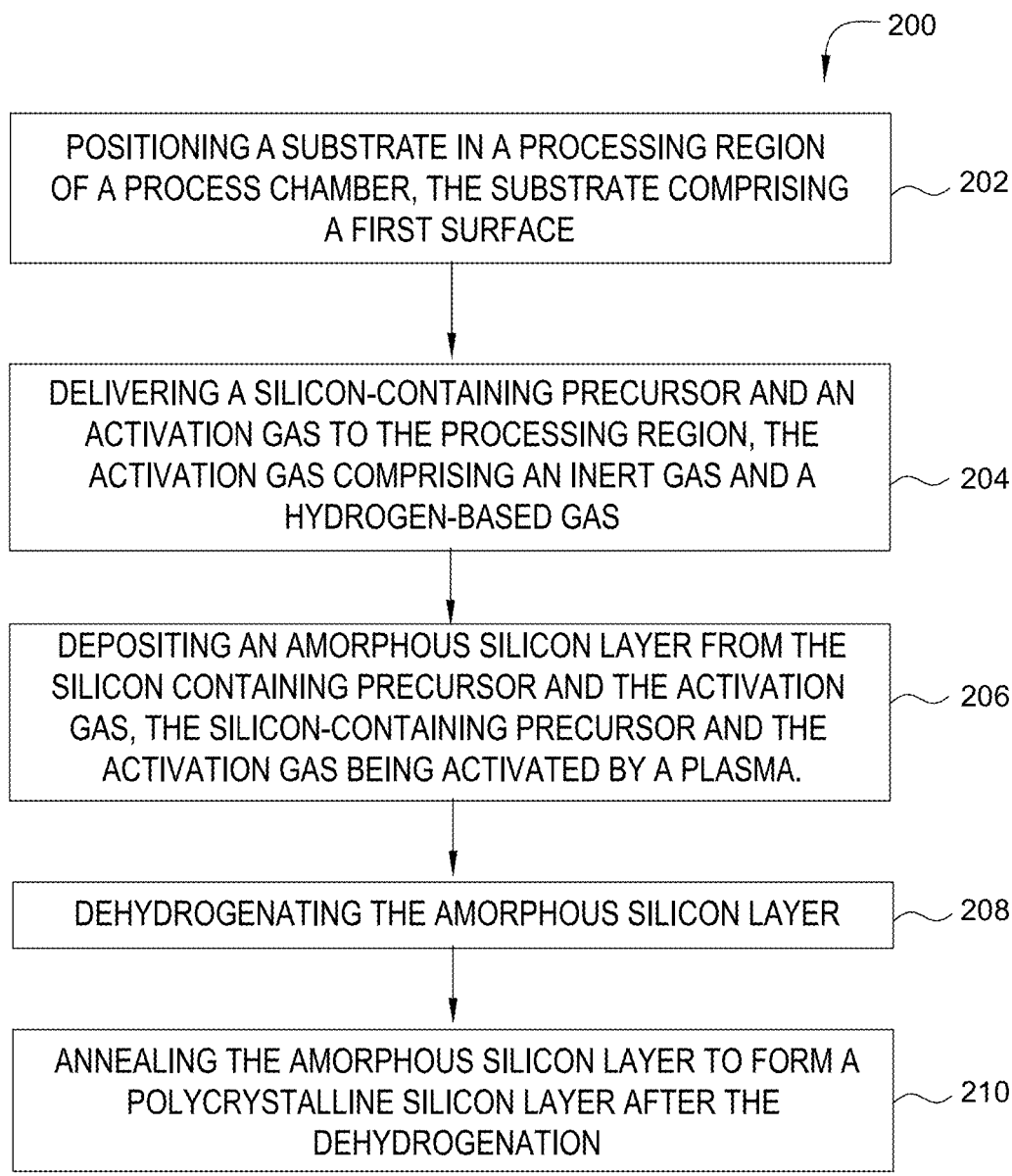
FIG. 2 depicts a flow diagram of one embodiment of a deposition process.

FIGS. 2 and 3 depict a method for depositing an amorphous silicon layer according to one embodiment. FIG. 2 depicts a flow diagram of one embodiment of a deposition method 200 that may be practiced in the chamber 100, as described in FIG. 1, or other suitable processing chamber. FIGS. 3A-3C depict a device 300 comprising a substrate 302, a silicon nitride buffer layer 304 and a silicon oxide buffer layer 306. The substrate 302 is processed by the method 200 according to one embodiment. The method 200 illustrates a method of depositing an amorphous silicon layer that may be used in TFT devices or diode devices. In one embodiment, the silicon containing layer as described is an amorphous silicon layer which can then later be thermally processed to form a polycrystalline silicon layer.

Figure 3A:
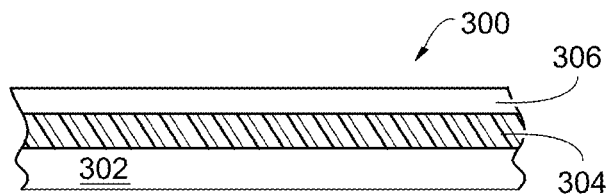
FIGS. 3A-3D depict a deposition process according to one embodiment.

The method 200 begins at element 202 by positioning the substrate 302, as shown in FIG. 3A, into a processing region of a process chamber, such as the PECVD chamber 100 depicted in FIG. 1. In one embodiment, the substrate 302 may be any one of glass substrate, plastic substrate, polymer substrate, metal substrate, singled substrate, roll-to-roll substrate, or other transparent substrate suitable for forming a thin film transistor thereon.

As shown with reference to FIG. 3A, the substrate 302 may have a first surface with one or more buffer layers disposed thereon, depicted here as the silicon nitride buffer layer 304 and the silicon oxide buffer layer 306. The buffer layers, such as the silicon nitride buffer layer 304 and the silicon oxide buffer layer 306, can either be deposited on the substrate 302 in the process chamber prior to depositing the amorphous silicon layer 308 or the substrate 302 can have the buffer layers formed prior to positioning in the process chamber. It is noted that the substrate 302 may have different combinations of films, structures or layers previously formed thereon to facilitate forming different device structures on the substrate 302. In one embodiment, the silicon nitride buffer layer 304, the silicon oxide buffer layer 306 or both are not present such that the amorphous silicon layer 308 may be formed on the substrate 302 directly or the remaining buffer layer as available.

With the substrate 302 positioned in the process chamber, a silicon-containing precursor and an activation gas are delivered to the processing region, as in element 204. The activation gas can include an inert gas and a hydrogen-based gas. Suitable silicon-containing precursors include, but are not limited to, silane ($SiH_4$), disilane ($Si_2H_6$), silicon tetrafluoride ($SiF_4$), tetraorthosiloxane (TEOS), silicon tetrachloride ($SiCl_4$), dichlorosilane ($SiH_2Cl_2$), and combinations thereof. Suitable examples of the inert gas include He, Ar, Ne, Kr or combinations thereof. Suitable examples of the hydrogen-based gas include hydrogen gas ($H_2$). In one embodiment, the silicon-containing precursor described herein is silane ($SiH_4$) gas and the first activation gas is Ar.

The activation gas is a gas mixture which includes hydrogen gas ($H_2$) at a concentration of less than 25% of the total gas mixture in combination with an inert gas. In one embodiment, the activation gas is a gas mixture of an inert gas, such as Ar gas, at 90 atomic % and hydrogen gas ($H_2$) at 10 atomic %. In another embodiment, the activation gas is a gas mixture of an inert gas, such as Ar gas, at 80 atomic % and $H_2$ gas at 20 atomic %. The inert gas can further be a combination of inert gases, such as Ar and Ne.

The silicon-containing precursor and the activation gas are supplied at a predetermined gas flow ratio. The predetermined gas flow ratio of activation gas to silicon-containing precursor assists deposition of the amorphous silicon layer with a minimum number of hydrogen atoms included in the film while maintaining a substantially similar deposition rate across the surface of the substrate. In one embodiment, the silicon-containing precursor and the activation gas are supplied into the processing chamber at a predetermined ratio, such as greater than 1:20. In one embodiment, the ratio (R) of the activation gas to the silicon-containing precursor is controlled about greater than 1:20, for example greater than 1:50, such as between about 1:60 and about 1:200, and in another example, about between about 1:70 and 1:100, such as about 1:75. Alternatively, the silicon-containing precursor and activation gas supplied into the processing chamber may be supplied by volumetric flow rate per substrate surface area (or substrate support surface, as an approximate equivalence). In one embodiment, the silicon-containing precursor, such as $SiH_4$ gas, may be supplied at between about 0.042 $sccm/cm^2$ and about 0.31 $sccm/cm^2$ into the processing chamber while the activation gas, such as a combination of Ar gas and $H_2$ gas, may be supplied at a flow rate at between about 0.55 $sccm/cm^2$ and about 3.29 $sccm/cm^2$ into the processing chamber. Thus, the ratio of volumetric flow rate per substrate surface area for activation gas to silicon-containing precursor is between about 1.8:1 to about 79:1. In other words, the gas mixture has a volumetric flow rate per surface area of substrate for the activation gas that is between about 1.8 times to about 79 times a volumetric flow rate per surface area of substrate for the silicon-containing precursor.

It is believed that by delivering low concentration hydrogen-based gas and high concentration inert gas in the activation gas mixture, the deposition profile from the silicon-containing gas/activation gas mixture close to the edge of the substrate can be maintained as compared to the center. Inert gases can be beneficially adapted to the deposition of amorphous silicon layers. However, deposition processes including an inert gas as the diluent tend to have a higher deposition rate at the edge of the substrate due to the shadow frame effect. The thicker stripe near the substrate edge therefore limits the further improvement of the overall uniformity. By including a hydrogen-based gas in the activation gas mixture, the deposition rate at the edge can be slightly and controllably reduced, such that the overall deposition profile is maintained constant from edge to center of the substrate.

Figure 3B:
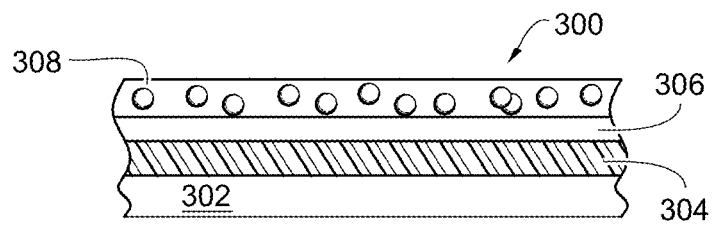

Once the silicon-containing precursor and the activation gas are present in the processing region, an amorphous silicon layer can be deposited from the silicon-containing precursor and the activation gas, as in element 206. In one embodiment, the silicon-containing precursor and the activation gas are activated in a plasma. As depicted in FIG. 3B, an amorphous silicon layer 308 is deposited over the silicon oxide buffer layer 306. The amorphous silicon layer 308 is generally maintained at a thickness of between 30 nm and 100 nm, such as from 40 nm to 55 nm.

Several process parameters may be controlled during the deposition process. A RF source power may be applied to maintain the plasma during deposition. In one embodiment, the RF source power density may be supplied between about 10 $mWatt/cm^2$ and about 200 $mWatt/cm^2$. Alternatively, a VHF power may be utilized to provide a frequency up to between about 27 MHz and about 200 MHz. The process pressure is maintained at between about 0.1 Torr and about 10 Torr, such as between about 0.5 Torr and about 5 Torr, such as about 0.8 Torr and about 2 Torr. The spacing of the substrate to the gas distribution plate assembly may be controlled in accordance with the substrate dimension. In one embodiment, the processing spacing for a substrate greater than 1 square meter is controlled between about 400 mils and about 1200 mils, for example, between about 400 mils and about 850 mils, such as 580 mils. The substrate temperature may be maintained from about 150 degrees Celsius to about 500 degrees Celsius, such as at about 370 degrees Celsius.

In one embodiment, a relatively lower RF power, such as lower than 1500 Watts or less than 100 $mWatt/cm^2$, may be utilized. It is believed that lower RF power utilized during deposition can assist in forming the amorphous silicon layer 308 with good uniformity control. It is believed that relatively lower RF power can reduce the sputtering effect that may be produced by the inert gas, thereby assisting in depositing the amorphous silicon layer 308 in a relatively gentle plasma environment, and thereby forming the amorphous silicon layer 308 with good uniformity and surface roughness control.

Figure 3C:
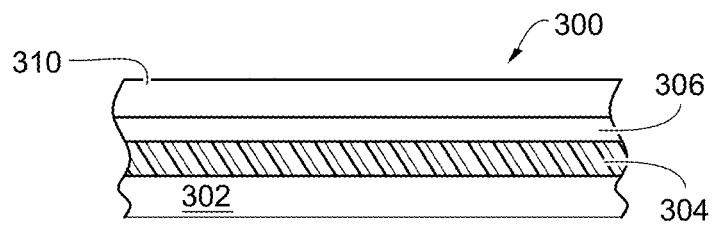

After sufficient growth of the amorphous silicon layer 308, the amorphous silicon layer can be dehydrogenated, as in element 208. Depicted in FIG. 3B, is the substrate 302 with the silicon nitride buffer layer 304, the silicon oxide buffer layer 306 and the lower amorphous silicon layer 308 and an upper amorphous silicon layer 310. In this embodiment, a dehydrogenation bake process may be performed to remove hydrogen from the amorphous silicon layer 308, as shown in FIG. 3B. During the post dehydrogenation bake process, hydrogen contained in the amorphous silicon layer 308 may be mostly driven out to form a dehydrogenated amorphous silicon layer 310, as shown in FIG. 3C. Thus, the post dehydrogenation bake process may be performed for a relatively short time frame, such as less than 10 minutes, for example less than 5 minute or may be optionally eliminated.

In one embodiment, the post dehydrogenation bake process may be performed in-situ process in the processing chamber wherein the amorphous silicon layer 308 was deposited. The post dehydrogenation bake process may heat the substrate 302 to a temperature greater than 400 degrees Celsius, such as between about 450 degrees Celsius and about 550 degree Celsius, to assist evaporating the hydrogen elements to form the dehydrogenated amorphous silicon layer 310.

It is believed that excess hydrogen in the amorphous silicon layer 308 can lead to device failure. An excess amount of hydrogen elements (e.g., an overly high concentration of hydrogen) in the amorphous silicon layer may cause hydrogen bubbling effect and severely damage the surface of the polycrystalline silicon. Excess hydrogen elements may also penetrate into the adjacent gate dielectric layer or other adjacent layers, prior to forming the polysilicon channel layer, thereby resulting in current leakage or other types of device failure. By performing the dehydrogenation process, the hydrogen effects on adjacent layers can be avoided.

Figure 3D:
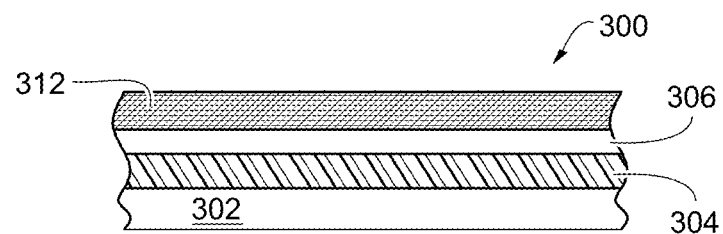

After the dehydrogenation bake process, the dehydrogenated amorphous silicon layer 310 can be annealed to form a polycrystalline silicon layer 312, as in element 210. Depicted in FIG. 3D, is the substrate 302, the silicon nitride buffer layer 304, the silicon oxide buffer layer 306 and the polycrystalline silicon layer 312. The polycrystalline silicon layer 312 is the annealed dehydrogenated amorphous silicon layer 310. The annealing process can be performed using a laser annealing process. The laser annealing process assists crystallizing the dehydrogenated amorphous silicon layer 310 into the polycrystalline silicon layer 312. The thermal energy provided during the laser annealing process assists growing the grains from the dehydrogenated amorphous silicon layer 310 into large size crystallized grains. In one embodiment, the laser annealing process utilized to anneal and crystallize the dehydrogenated amorphous silicon layer 310 can be an ELA process. The laser annealing process can thermally process the substrate to a temperature between about 100 degrees Celsius and about 1500 degrees Celsius. After the formation of the polycrystalline silicon layer 312, a patterning process or other deposition process may be performed to form the source and drain areas.

Figure 4:
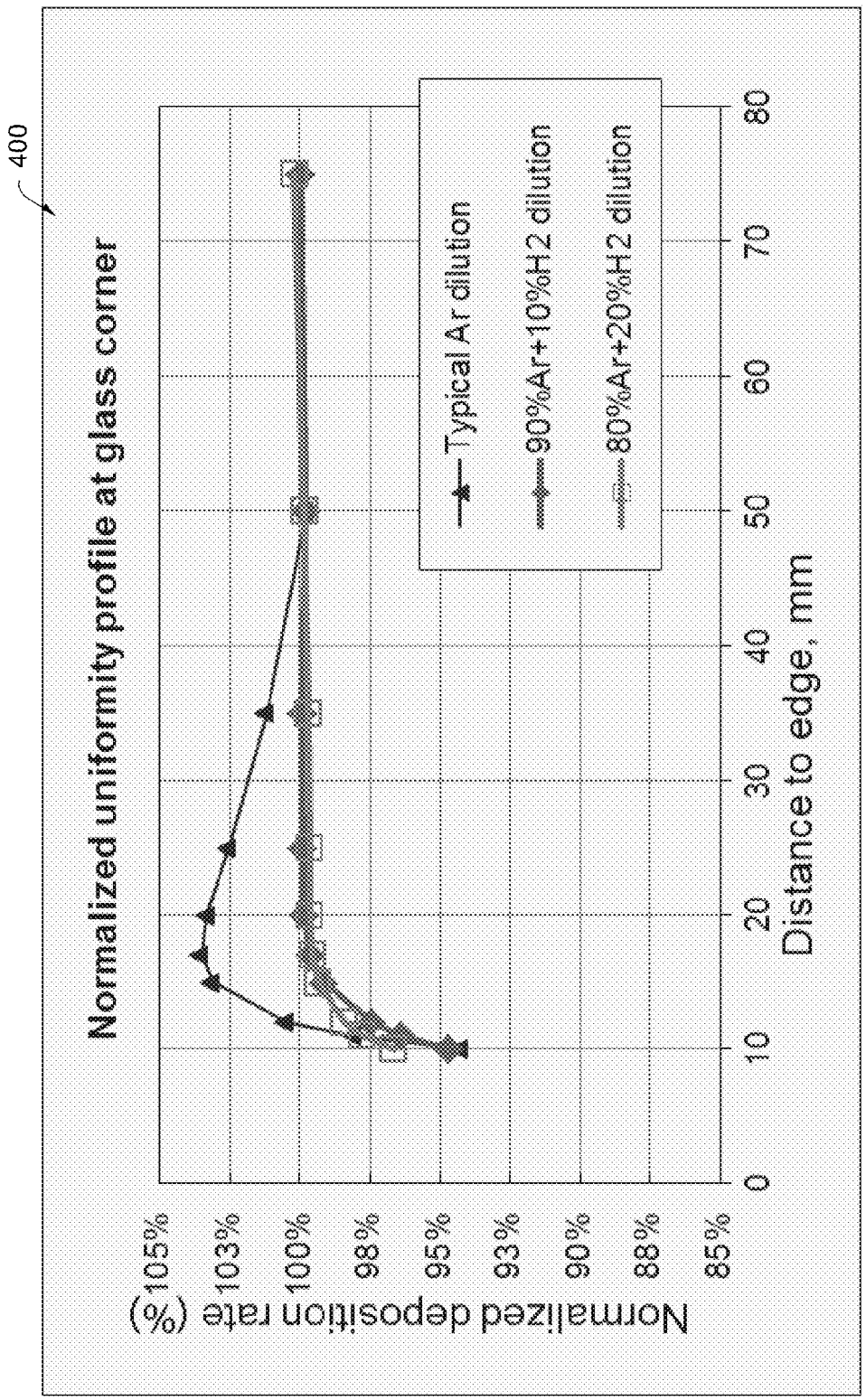
FIG. 4 depicts a graph of the normalized uniformity profile for polycrystalline silicon layers deposited by methods disclosed herein.

FIG. 4 depicts a graph 400 of the normalized uniformity profile for polycrystalline silicon layers deposited by methods disclosed herein. The graph 400 shows the normalized deposition rate (in percent) from three separate process recipes as compared to distance from the edge of the substrate. The first process recipe used the Ar gas dilution only as the activation gas, the second process recipe uses an activation gas composed of the dilution of 90% Ar gas and 10% $H_2$ gas and the third process recipe uses an activation gas composed of the dilution of 80% Ar gas and 20% $H_2$ gas. All other process conditions were maintained the same (described above with reference to FIG. 2) using an RF power density of from 50 mWatts/cm$^2$ to 200 mWatts/cm$^2$, a vacuum pressure of from 1000 mTorr to 2000 mTorr, and susceptor temperature of from 400 degrees Celsius to 470 degrees Celsius.

The first process recipe (activation gas consisting of Ar only) depicts variation of the deposition profile of the amorphous silicon layer from the edge of the substrate to approximately 75 mm inward from the edge. The deposition begins at 10 mm due to the shadow frame overlaying the edge of the substrate (known hereafter as the 10 mm edge exclusion). Between approximately 10 mm and approximately 20 mm, there is a deposition spike from 98% of the normalized deposition rate up to approximately 104% of the normalized deposition rate (apparently peaking around 17 mm-18 mm). This spike in deposition rate gradually decreases to level out at approximately 50 mm from the edge. Thus, the first process recipe significantly increases deposition at the between approximately 10 mm and approximately 20 mm from the edge over deposition at approximately 50 mm from the edge and further in.

The second process recipe (activation gas consisting of 90% Ar and 10% $H_2$) depicts variation of the deposition profile of the amorphous silicon layer from the edge of the substrate to approximately 75 mm inward from the edge. As above, the deposition has a 10 mm edge exclusion. Between approximately 10 mm and approximately 20 mm, the deposition increase approximates a first order curve from 97% of the normalized deposition rate up to approximately 100% of the normalized deposition rate. Once the deposition rate reaches 100%, the deposition rate is substantially maintained until the last measured point (75 mm from the edge). Thus, the second process recipe provides substantially stable deposition between 20 mm and 70 mm with a relatively fast increase in deposition at the between approximately 10 mm and approximately 20 mm from the edge before leveling off at 100% of deposition at 20 mm.

The third process recipe (activation gas consisting of 80% Ar and 20% $H_2$) depicts variation of the deposition profile of the amorphous silicon layer from the edge of the substrate to approximately 75 mm inward from the edge. As above, the deposition has a 10 mm edge exclusion. Between approximately 10 mm and approximately 20 mm, the deposition increase approximates a first order curve from 94% of the normalized deposition rate up to approximately 100% of the normalized deposition rate. Once the deposition rate reaches 100%, the deposition rate is substantially maintained until the last measured point (75 mm from the edge). Thus, the second process recipe provides substantially stable deposition between 20 mm and 70 mm with a relatively fast increase in deposition at the between approximately 10 mm and approximately 20 mm from the edge before leveling off at 100% of deposition at 20 mm. The first order curve for deposition in the third process recipe is more gradual than that of the second process recipe.

The results measured at the substrate corner showed that the uniformity profile of the film processed with the dilution of 90% Ar and 10% $H_2$ gas decreases the deposition rate effectively in the range of the edge exclusion from 10 mm to 30 mm. The uniformity profile processed with the dilution of 80% Ar and 20% $H_2$ gas further improves the thickness variation to less than 3% at 10 mm edge exclusion. The uniformity measured over the whole substrate showed that the process diluted with the Ar/$H_2$ gas mixture improved the uniformity to 3.1% at 10 mm edge exclusion compared to the one of 5.2% which was diluted with the Ar gas only.

Embodiments disclosed herein relate to improved deposition uniformity in amorphous silicon films. By including a low hydrogen inert gas/hydrogen based gas combination and the silicon-containing gas in the formation of the amorphous silicon layer, the deposition profile of the polycrystalline silicon post anneal can be made more uniform.

While the foregoing is directed to embodiments of the invention, other and further embodiments of the invention may be devised without departing from the basic scope thereof.

The invention claimed is:

1. A method comprising:
positioning a substrate in a processing region of a process chamber, the substrate having a surface with at least one buffer layer formed thereon;
delivering a silicon-containing precursor and an activation gas to the processing region, the activation gas comprising an inert gas and a hydrogen-based gas, wherein the activation gas is no more than 20 atomic % hydrogen, and wherein the ratio of the activation gas to the silicon-containing precursor is greater than about 1:20;
igniting the precursor and activation gas into a plasma;
depositing an amorphous silicon layer on the substrate;
dehydrogenating the amorphous silicon layer; and
annealing the dehydrogenated amorphous silicon layer to form a polycrystalline silicon layer.

2. The method of claim 1, wherein the silicon-containing precursor comprises silane.

3. The method of claim 1, wherein the hydrogen-based gas comprises hydrogen gas ($H_2$).

4. The method of claim 1, wherein the inert gas comprises argon (Ar).

5. The method of claim 1, wherein the annealing is performed using excimer laser annealing.

6. The method of claim 1, wherein the dehydrogenation of the amorphous silicon layer is bake process.

7. The method of claim 6, wherein the bake process comprises heating the substrate to a temperature between about 450 degrees Celsius and about 550 degree Celsius.

8. The method of claim 1, wherein the activation gas comprises the inert gas at 90 atomic % and the hydrogen-based gas at 10 atomic %.

9. A method comprising:
positioning a substrate in a processing region of a process chamber, the substrate having a first surface;
depositing a first buffer layer comprising silicon nitride on the first surface;
depositing a second buffer layer comprising silicon oxide on the first buffer layer;
delivering a silicon-containing precursor and an activation gas to a processing region, the activation gas comprising an inert gas and a hydrogen-based gas, wherein the activation qas is no more than 20 atomic % hydrogen, and wherein the ratio of the activation gas to the silicon-containing precursor is greater than about 1:20;
igniting the precursor and the activation gas into a plasma;
depositing an amorphous silicon layer from the silicon-containing precursor and the activation gas;

dehydrogenating the amorphous silicon layer; and
annealing the dehydrogenated amorphous silicon layer to form a polycrystalline silicon layer.

10. The method of claim 9, wherein the silicon-containing precursor comprises silane.

11. The method of claim 9, wherein the hydrogen-based gas comprises hydrogen gas ($H_2$).

12. The method of claim 9, wherein the inert gas comprises argon (Ar).

13. The method of claim 9, wherein the annealing is performed using excimer laser annealing.

14. The method of claim 9, wherein the dehydrogenation of the amorphous silicon layer is bake process.

15. The method of claim 14, wherein the bake process comprises heating the substrate to a temperature between about 450 degrees Celsius and about 550 degree Celsius.

16. The method of claim 14, wherein the bake process comprises heating the substrate to a temperature above about 400 degrees Celsius for a time period of less than 5 minutes.

17. The method of claim 9, wherein the activation gas comprises the inert gas at 90 atomic % and the hydrogen-based gas at 10 atomic %.

18. A method comprising:
positioning a substrate in a processing region of a process chamber, the substrate having a first surface;
depositing a first buffer layer comprising silicon nitride on the first surface of the substrate;
depositing a second buffer layer comprising silicon oxide on the first buffer layer;
delivering a deposition gas comprising silane or disilane and an activation gas to a processing region, the activation gas substantially comprising argon gas (Ar) and hydrogen gas ($H_2$), wherein the activation gas is no more than 20 atomic % hydrogen, and wherein the ratio of the activation gas to the silicon-containing precursor is greater than about 1:20;
igniting the deposition gas and activation gas into a plasma;
depositing an amorphous silicon layer from the silicon-containing precursor and the activation gas;
dehydrogenating the amorphous silicon layer; and
annealing the dehydrogenated amorphous silicon layers to form a polycrystalline silicon layer.

* * * * *